(12) United States Patent
Callanan (10) Patent No.: US 8,963,576 B2
(45) Date of Patent: Feb. 24, 2015

(54) INCREASED TRANSITION SPEED SWITCHING DEVICE DRIVER

(71) Applicant: Cree, Inc., Durham, NC (US)

(72) Inventor: Robert J. Callanan, Raleigh, NC (US)

(73) Assignee: Cree, Inc., Durham, NC (US)

( * ) Notice: Subject to any disclaimer, the term of this patent is extended or adjusted under 35 U.S.C. 154(b) by 94 days.

(21) Appl. No.: 13/656,264

(22) Filed: Oct. 19, 2012

(65) Prior Publication Data

US 2014/0111246 A1    Apr. 24, 2014

(51) Int. Cl.
*H03K 19/01*    (2006.01)
(52) U.S. Cl.
USPC ................................. 326/18; 326/26
(58) Field of Classification Search
USPC .................... 326/21, 26, 27, 17, 18
See application file for complete search history.

(56) References Cited

U.S. PATENT DOCUMENTS

| | | | | |
|---|---|---|---|---|
| 6,661,276 B1 * | 12/2003 | Chang | ............................ | 327/427 |
| 6,972,973 B2 | 12/2005 | Abe et al. | | |
| 7,098,703 B2 | 8/2006 | Harvey | | |
| 7,116,153 B2 * | 10/2006 | Pai | ................. | 327/430 |
| 7,148,666 B1 | 12/2006 | Tai et al. | | |
| 2009/0020409 A1 | 1/2009 | Fagrell | | |
| 2011/0163797 A1 | 7/2011 | Posat | | |
| 2012/0206169 A1 | 8/2012 | Kimura | | |
| 2012/0306545 A1 * | 12/2012 | Machida et al. | ............... | 327/109 |
| 2012/0326770 A1 | 12/2012 | Murakami | | |
| 2013/0106468 A1 * | 5/2013 | Aso | ................................ | 327/109 |

FOREIGN PATENT DOCUMENTS

| | | |
|---|---|---|
| DE | 4446327 A1 | 7/1996 |
| DE | 19655180 C2 | 5/2001 |

OTHER PUBLICATIONS

Advisory Action for U.S. Appl. No. 13/438,927, mailed Nov. 12, 2013, 3 pages.
Franke, W-Toke et al., "Comparison of Switching and Conducting Performance of SiC-JFET and SiC-BJT with a State of the Art IGBT," 13th European Conference on Power Electronics and Applications, Sep. 8, 2009, 10 pages.
Author Unknown, "IXD414PI/414YI/414CI/414SI: 14 Amp Low-Side Ultrafast MOSFET Driver," IXYS Corporation, Copyright: 2004, 10 pages.
Rabkowski, Jacek et al., "Low-Loss High-Performance Base-Drive Unit for SiC BJTs," IEEE Transactions on Power Electronics, vol. 27, No. 5, May 2012, pp. 2633-2643.

(Continued)

*Primary Examiner* — Don Le
(74) *Attorney, Agent, or Firm* — Withrow & Terranova, P.L.L.C.

(57) ABSTRACT

A switching device driver, which includes switching circuitry and a first capacitive element, which is coupled to the switching circuitry, is disclosed. The switching circuitry receives a logic level input signal and provides a switching control output signal to a switching device based on the logic level input signal. When the logic level input signal has a first logic level, the switching circuitry charges the first capacitive element. When the logic level input signal transitions from the first logic level to a second logic level, the switching circuitry at least partially discharges the first capacitive element to rapidly transition the switching control output signal, thereby causing the switching device to quickly change states.

24 Claims, 8 Drawing Sheets

(56) References Cited

OTHER PUBLICATIONS

Burgos, Rolando et al., "Design Considerations of a Fast 0-Ω Gate-Drive Circuit for 1.2 kV SiC JFET Devices in Phase-Leg Configuration," Energy Conversion Congress and Exposition, Sep. 20, 2009, pp. 2293-2300.

International Search Report for PCT/US2013/065206, mailed Jan. 29, 2014, 13 pages.

Restriction Requirement for U.S. Appl. No. 13/438,927, mailed Mar. 13, 2013, 5 pages.

Non-Final Office Action for U.S. Appl. No. 13/438,927, mailed Apr. 30, 2013, 9 pages.

International Search Report and Written Opinion for PCT/US2013/034949, mailed Jul. 22, 2013, 12 pages.

Final Office Action for U.S. Appl. No. 13/438,927, mailed Sep. 5, 2013, 10 pages.

International Preliminary Report on Patentability for PCT/US2013/034949, mailed Oct. 16, 2014, 9 pages.

Non-Final Office Action for U.S. Appl. No. 13/438,927, mailed Oct. 6, 2014, 9 pages.

* cited by examiner

INCREASED TRANSITION SPEED SWITCHING DEVICE DRIVER

FIELD OF THE DISCLOSURE

Embodiments of the present disclosure relate to switching devices, which are used in digital circuits, and switching device drivers, which are used to drive control inputs to the switching devices.

BACKGROUND

In certain applications, transistors may be used as switching devices in digital circuits. A bipolar junction transistor (BJT), a junction field effect transistor (JFET), or a metal oxide semiconductor field effect transistor (MOSFET) are examples of different type of transistors that may be used as switching devices in digital circuits. However, each of the examples presented above has a specific type of control input, which has specific input drive requirements. Therefore, switching device drivers, which are used to drive control inputs to the switching devices, must meet the specific input drive requirements. Additionally, to actuate the switching devices quickly and efficiently, the switching device drivers must drive the control inputs in a manner that provides quick and efficient actuation of the switching devices.

SUMMARY

Embodiments of the present disclosure relate to a circuit, which includes a switching device driver. The switching device driver includes switching circuitry and a first capacitive element, which is coupled to the switching circuitry. The switching circuitry receives a logic level input signal and provides a switching control output signal to a switching device based on the logic level input signal. When the logic level input signal has a first logic level, the switching circuitry charges the first capacitive element. When the logic level input signal transitions from the first logic level to a second logic level, the switching circuitry at least partially discharges the first capacitive element to rapidly transition the switching control output signal, thereby causing the switching device to quickly change states.

In one embodiment of the circuit, the switching control output signal is fed to a control input to the switching device. The switching device may have at least one input capacitance presented at the control input. Further, the switching device driver and the switching device may have series parasitic inductances in the signal path from the switching device driver through the control input. As a result, to cause the switching device to change states, when the switching control output signal transitions, the input capacitance(s) to the switching device must be charged via the series parasitic inductances. In this regard, the rate at which the input capacitance(s) can be charged is inversely related to a magnitude of the input capacitance(s), inversely related to a magnitude of the series parasitic inductances, directly related to a maximum voltage available via the switching control output signal, and directly related to a maximum current available via the switching control output signal.

As such, in one embodiment of the switching device driver, to cause the switching device to quickly change states, a maximum voltage at a first end of the first capacitive element is greater than a maximum voltage of the logic level input signal. The larger maximum voltage quickly builds current in the series parasitic inductances to charge the input capacitance(s). In a first exemplary embodiment of the switching device driver, the maximum voltage at the first end of the first capacitive element is on the order of about two times the maximum voltage of the logic level input signal. In a second exemplary embodiment of the switching device driver, the maximum voltage at the first end of the first capacitive element is on the order of about three times the maximum voltage of the logic level input signal.

In one embodiment of the first capacitive element, if a capacitance of the first capacitive element is too large, the discharging of the first capacitive element may charge the input capacitance(s) excessively, thereby causing damage to the switching device, inefficient operation, or both. Therefore, the first capacitive element may be selected, such that the capacitance of the first capacitive element is based on an estimation of the input capacitance(s).

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
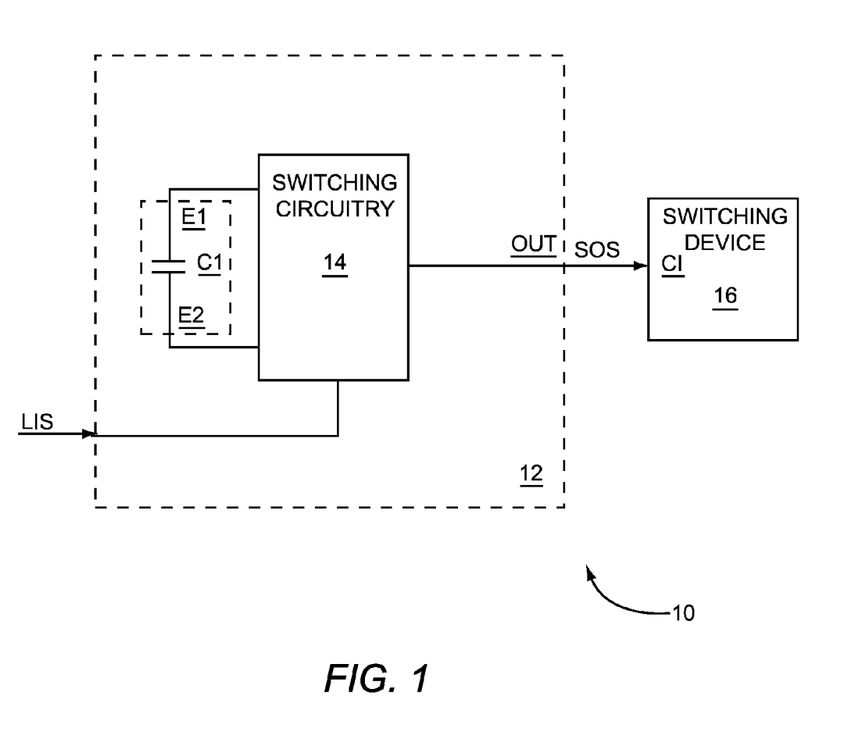
FIG. 1 illustrates a circuit according to one embodiment of the circuit.

There is a need for a device driver that drives a control input to a switching device that meets specific input drive requirements of the switching device and provides quick and efficient actuation of the switching device. FIG. 1 illustrates a circuit 10 according to one embodiment of the circuit 10. The circuit 10 includes a switching device driver 12. The switching device driver 12 includes switching circuitry 14 and a first capacitive element C1, which is coupled to the switching circuitry 14. The first capacitive element C1 has a first end E1 and a second end E2. The switching circuitry 14 receives a logic level input signal LIS and provides a switching control output signal SOS via an output OUT to a switching device 16 based on the logic level input signal LIS. When the logic level input signal LIS has a first logic level, the switching circuitry 14 charges the first capacitive element C1. When the logic level input signal LIS transitions from the first logic level to a second logic level, the switching circuitry 14 at least partially discharges the first capacitive element C1 to rapidly transition the switching control output signal SOS, thereby causing the switching device 16 to quickly change states. The switching device 16 receives the switching control output signal SOS via a control input CI. In one embodiment of the circuit 10, the circuit 10 includes the switching device 16. In an alternate embodiment of the circuit 10, the switching device 16 is external to the circuit 10.

To rapidly transition the switching control output signal SOS, the switching control output signal SOS must have a short transition time. As such, in a first embodiment of rapidly transitioning the switching control output signal SOS, a transition time of the switching control output signal SOS is less than about 10 microseconds. In a second embodiment of rapidly transitioning the switching control output signal SOS, the transition time of the switching control output signal SOS is less than about 1 microsecond. In a third embodiment of rapidly transitioning the switching control output signal SOS, the transition time of the switching control output signal SOS is less than about 100 nanoseconds. In a fourth embodiment of rapidly transitioning the switching control output signal SOS, the transition time of the switching control output signal SOS is less than about 10 nanoseconds. In a fifth embodiment of rapidly transitioning the switching control output signal SOS, the transition time of the switching control output signal SOS is less than about 5 nanoseconds. In a sixth embodiment of rapidly transitioning the switching control output signal SOS, the transition time of the switching control output signal SOS is less than about one nanosecond.

In a seventh embodiment of rapidly transitioning the switching control output signal SOS, the transition time of the switching control output signal SOS is between about one nanosecond and about ten nanoseconds. In an eighth embodiment of rapidly transitioning the switching control output signal SOS, the transition time of the switching control output signal SOS is between about ten nanoseconds and about 100 nanoseconds. In a ninth embodiment of rapidly transitioning the switching control output signal SOS, the transition time of the switching control output signal SOS is between about 100 nanoseconds and about one microsecond. In a tenth embodiment of rapidly transitioning the switching control output signal SOS, the transition time of the switching control output signal SOS is between about one microsecond and about ten microseconds.

In one embodiment of the circuit 10, the switching device 16 may have at least one input capacitance presented at the control input CI. Further, the switching device driver 12 and the switching device 16 may have series parasitic inductances in the signal path from the switching device driver 12 through the control input CI. As a result, to cause the switching device 16 to change states, when the switching control output signal SOS transitions, the input capacitance(s) to the switching device 16 must be charged via the series parasitic inductances. In this regard, the rate at which the input capacitance(s) can be charged is inversely related to a magnitude of the input capacitance(s), inversely related to a magnitude of the series parasitic inductances, directly related to a maximum voltage available via the switching control output signal SOS, and directly related to a maximum current available via the switching control output signal SOS.

As such, in one embodiment of the switching device driver 12, to cause the switching device 16 to quickly change states, a maximum voltage at the first end E1 of the first capacitive element C1 is greater than a maximum voltage of the logic level input signal LIS. The larger maximum voltage quickly builds current in the series parasitic inductances to charge the input capacitance(s). In a first exemplary embodiment of the switching device driver 12, the maximum voltage at the first end E1 of the first capacitive element C1 is on the order of about two times the maximum voltage of the logic level input signal LIS. In a second exemplary embodiment of the switching device driver 12, the maximum voltage at the first end E1 of the first capacitive element C1 is on the order of about three times the maximum voltage of the logic level input signal LIS.

In one embodiment of the first capacitive element C1, if a capacitance of the first capacitive element C1 is too large, the discharging of the first capacitive element C1 may charge the input capacitance(s) excessively, thereby causing damage to the switching device 16, inefficient operation, or both. Therefore, the first capacitive element C1 may be selected, such that the capacitance of the first capacitive element C1 is based on an estimation of the input capacitance(s).

In one embodiment of the switching device driver 12, the first logic level is a logic LOW and the second logic level is a logic HIGH. In an alternate embodiment of the switching device driver 12, the first logic level is a logic HIGH and the second logic level is a logic LOW. In one embodiment of the circuit 10, after the logic level input signal LIS transitions from the first logic level to the second logic level, the switching device 16 transitions from an OFF state to an ON state. In an alternate embodiment of the circuit 10, after the logic level input signal LIS transitions from the first logic level to the second logic level, the switching device 16 transitions from an ON state to an OFF state.

Figure 2:
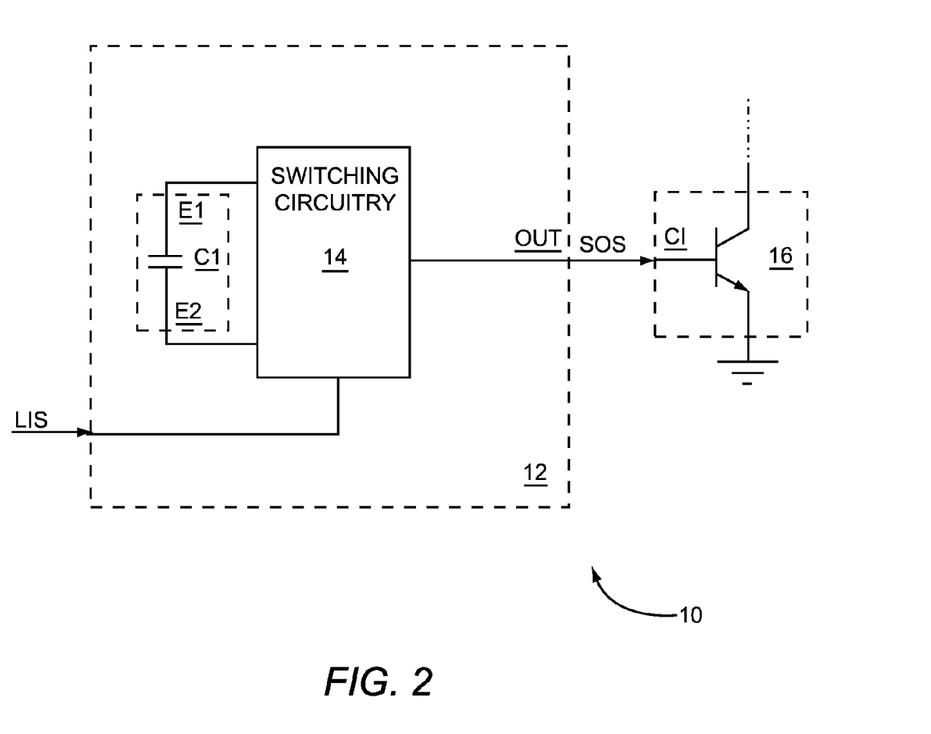
FIG. 2 illustrates the circuit according to an alternate embodiment of the circuit.

FIG. 2 illustrates the circuit 10 according to an alternate embodiment of the circuit 10. The circuit 10 illustrated in FIG. 2 is similar to the circuit 10 illustrated in FIG. 1, except in the circuit 10 illustrated in FIG. 2, the switching device 16 is a bipolar junction transistor (BJT) element. A base of the BJT element is the control input CI. As such, the switching circuitry 14 provides the switching control output signal SOS to the base of the BJT element via the output OUT. An emitter of the BJT element is coupled to ground. In an alternate embodiment of the BJT element (not shown), the emitter of the BJT element is not coupled to ground. In one embodiment of the BJT element, the BJT element is a silicon carbide BJT element. The BJT element has a base-to-emitter capacitance and a base-to-collector capacitance. In one embodiment of the circuit 10, the capacitance of the first capacitive element C1 is based on an estimated base-to-emitter capacitance of the BJT element, an estimated base-to-collector capacitance of the BJT element, or both.

Figure 3:
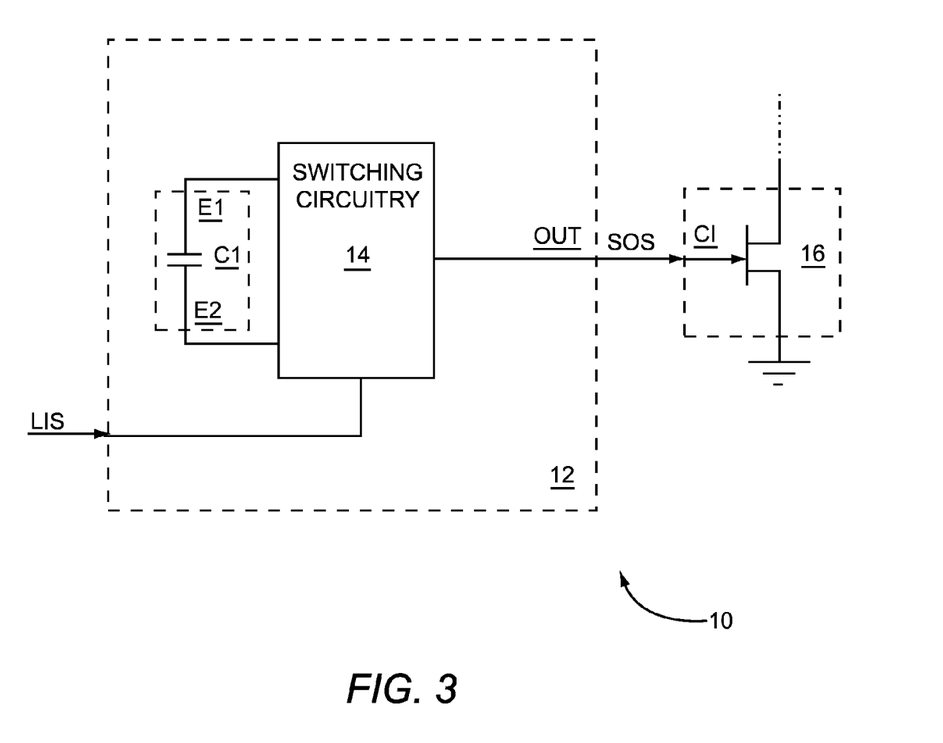
FIG. 3 illustrates the circuit according to an additional embodiment of the circuit.

FIG. 3 illustrates the circuit 10 according to an additional embodiment of the circuit 10. The circuit 10 illustrated in FIG. 3 is similar to the circuit 10 illustrated in FIG. 1, except in the circuit 10 illustrated in FIG. 3, the switching device 16 is a junction field effect transistor (JFET) element. A gate of the JFET element is the control input CI. As such, the switching circuitry 14 provides the switching control output signal SOS to the gate of the JFET element via the output OUT. A source of the JFET element is coupled to ground. In an alternate embodiment of the JFET element (not shown), the source of the JFET element is not coupled to ground. In one embodiment of the JFET element, the JFET element is a silicon carbide JFET element. The JFET element has a gate-to-source capacitance and a gate-to-drain capacitance. In one embodiment of the circuit 10, the capacitance of the first capacitive element C1 is based on an estimated gate-to-source capacitance of the JFET element, an estimated gate-to-drain capacitance of the JFET element, or both.

Figure 4:
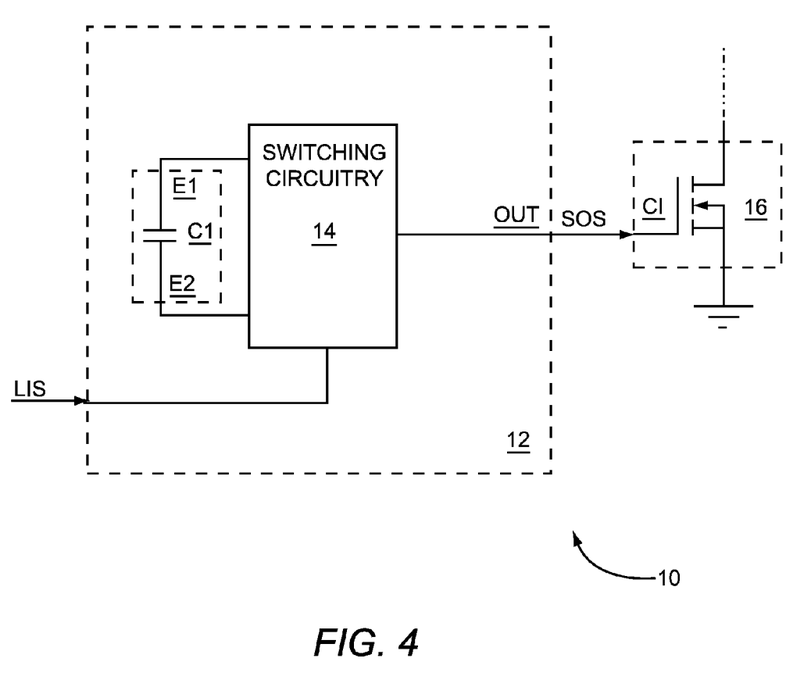
FIG. 4 illustrates the circuit according to another embodiment of the circuit.

FIG. 4 illustrates the circuit 10 according to another embodiment of the circuit 10. The circuit 10 illustrated in FIG. 4 is similar to the circuit 10 illustrated in FIG. 1, except in the circuit 10 illustrated in FIG. 4, the switching device 16 is a metal oxide semiconductor field effect transistor (MOSFET) element A gate of the MOSFET element is the control input CI. As such, the switching circuitry 14 provides the switching control output signal SOS to the gate of the MOSFET element via the output OUT. A source of the MOSFET element is coupled to ground. In an alternate embodiment of the MOSFET element (not shown), the source of the MOSFET element is not coupled to ground. In one embodiment of the MOSFET element, the MOSFET element is a silicon carbide MOSFET element. The MOSFET element has a gate-to-source capacitance and a gate-to-drain capacitance. In one embodiment of the circuit 10, the capacitance of the first capacitive element C1 is based on an estimated gate-to-source capacitance of the MOSFET element, an estimated gate-to-drain capacitance of the MOSFET element, or both.

Figure 5:
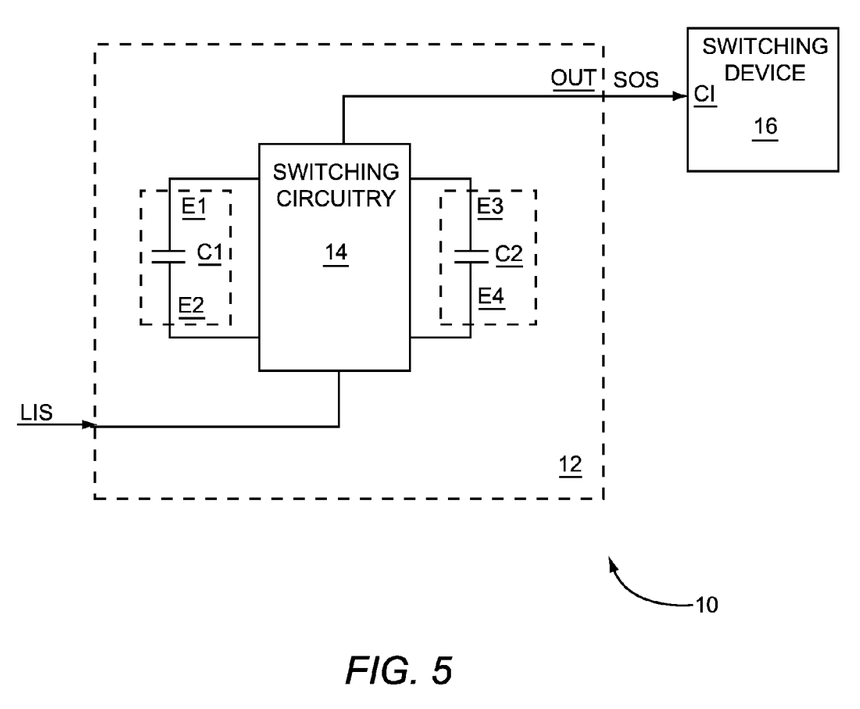
FIG. 5 illustrates the circuit according to a further embodiment of the circuit.

FIG. 5 illustrates the circuit 10 according to a further embodiment of the circuit 10. The circuit 10 illustrated in FIG. 5 is similar to the circuit 10 illustrated in FIG. 1, except in the circuit 10 illustrated in FIG. 5, the switching device driver 12 further includes a second capacitive element C2, which is coupled to the switching circuitry 14. In this regard, when the logic level input signal LIS has the second logic level, the switching circuitry 14 charges the second capacitive element C2. Further, when the logic level input signal LIS transitions from the second logic level to the first logic level, the switching circuitry 14 at least partially discharges the second capacitive element C2 to rapidly transition the switching control output signal SOS, thereby causing the switching device 16 to quickly change states.

Figure 6:
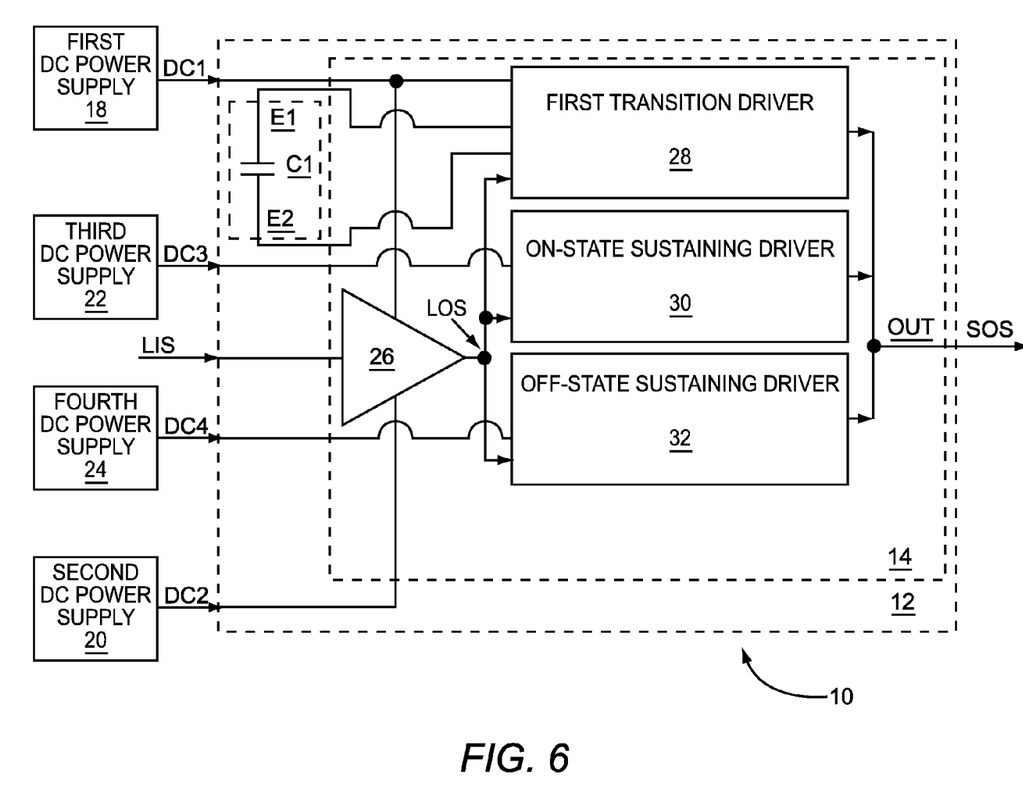
FIG. 6 illustrates the circuit according to one embodiment of the circuit.

FIG. 6 illustrates the circuit 10 according to one embodiment of the circuit 10. The circuit 10 illustrated in FIG. 6 is similar to the circuit 10 illustrated in FIG. 1, except in the circuit 10 illustrated in FIG. 6, the switching device 16 (FIG. 1) is not shown, details of the switching device driver 12 are illustrated, and the circuit 10 further includes a first DC power supply 18, a second DC power supply 20, a third DC power supply 22, and a fourth DC power supply 24. The switching circuitry 14 includes an input buffer 26, a first transition driver 28, an on-state sustaining driver 30, and an off-state sustaining driver 32.

The first transition driver 28 is coupled between an output from the input buffer 26 and the output OUT. The on-state sustaining driver 30 is coupled between the output from the input buffer 26 and the output OUT. The off-state sustaining driver 32 is coupled between the output from the input buffer 26 and the output OUT. The first capacitive element C1 is coupled to the first transition driver 28. The first DC power supply 18 provides a first DC power supply signal DC1 to the input buffer 26 and the first transition driver 28. The second DC power supply 20 provides a second DC power supply signal DC2 to the input buffer 26. The third DC power supply 22 provides a third DC power supply signal DC3 to the on-state sustaining driver 30. The fourth DC power supply 24 provides a fourth DC power supply signal DC4 to the off-state sustaining driver 32. The input buffer 26 receives and buffers the logic level input signal LIS to provide a logic level output signal LOS to the first transition driver 28, the on-state sustaining driver 30, and the off-state sustaining driver 32 based on the first DC power supply signal DC1 and the second DC power supply signal DC2.

In a first embodiment of the first DC power supply signal DC1, a voltage of the first DC power supply signal DC1 is equal to about 10 volts. In a second embodiment of the first DC power supply signal DC1, the voltage of the first DC power supply signal DC1 is equal to about 5 volts. In a third embodiment of the first DC power supply signal DC1, the voltage of the first DC power supply signal DC1 is equal to about 3.3 volts. In a fourth embodiment of the first DC power supply signal DC1, the voltage of the first DC power supply signal DC1 is between about 0.5 volts and about 2.5 volts. In a fifth embodiment of the first DC power supply signal DC1, the voltage of the first DC power supply signal DC1 is between about 2.5 volts and about 4 volts. In a sixth embodiment of the first DC power supply signal DC1, the voltage of the first DC power supply signal DC1 is between about 4 volts and about 7.5 volts. In a seventh embodiment of the first DC power supply signal DC1, the voltage of the first DC power supply signal DC1 is between about 7.5 volts and about 15 volts. In an eighth embodiment of the first DC power supply signal DC1, the voltage of the first DC power supply signal DC1 is between about 15 volts and about 25 volts.

In a first embodiment of the second DC power supply signal DC2, a voltage of the second DC power supply signal DC2 is equal to about −10 volts. In a second embodiment of the second DC power supply signal DC2, the voltage of the second DC power supply signal DC2 is equal to about −5 volts. In a third embodiment of the second DC power supply signal DC2, the voltage of the second DC power supply signal DC2 is equal to about −3.3 volts. In a fourth embodiment of the second DC power supply signal DC2, the voltage of the second DC power supply signal DC2 is between about −0.5 volts and about −2.5 volts. In a fifth embodiment of the second DC power supply signal DC2, the voltage of the second DC power supply signal DC2 is between about −2.5 volts and about −4 volts. In a sixth embodiment of the second DC power supply signal DC2, the voltage of the second DC power supply signal DC2 is between about −4 volts and about −7.5 volts. In a seventh embodiment of the second DC power supply signal DC2, the voltage of the second DC power supply signal DC2 is between about −7.5 volts and about −15 volts. In an eighth embodiment of the second DC power supply signal DC2, the voltage of the second DC power supply signal DC2 is between about −15 volts and about −25 volts.

In a first embodiment of the third DC power supply signal DC3, a voltage of the third DC power supply signal DC3 is equal to about 5 volts. In a second embodiment of the third DC power supply signal DC3, the voltage of the third DC power supply signal DC3 is equal to about 4 volts. In a third embodiment of the third DC power supply signal DC3, the voltage of the third DC power supply signal DC3 is between about 0.5 volts and about 3 volts. In a fourth embodiment of the third DC power supply signal DC3, the voltage of the third DC power supply signal DC3 is between about 3 volts and about 7 volts. In a fifth embodiment of the third DC power supply signal DC3, the voltage of the third DC power supply signal DC3 is between about 7 volts and about 15 volts.

In a first embodiment of the fourth DC power supply signal DC4, a voltage of the fourth DC power supply signal DC4 is equal to about −5 volts. In a second embodiment of the fourth DC power supply signal DC4, the voltage of the fourth DC power supply signal DC4 is equal to about −6 volts. In a third embodiment of the fourth DC power supply signal DC4, the voltage of the fourth DC power supply signal DC4 is between about −0.5 volts and about −3 volts. In a fourth embodiment of the fourth DC power supply signal DC4, the voltage of the fourth DC power supply signal DC4 is between about −3 volts and about −7 volts. In a fifth embodiment of the fourth DC power supply signal DC4, the voltage of the fourth DC power supply signal DC4 is between about −7 volts and about −15 volts. In a sixth embodiment of the fourth DC power supply signal DC4, the voltage of the fourth DC power supply signal DC4 is equal to about zero volts.

In one embodiment of the circuit 10, the first DC power supply 18 is omitted. In one embodiment of the circuit 10, the second DC power supply 20 is omitted. In one embodiment of the circuit 10, the third DC power supply 22 is omitted. In one embodiment of the circuit 10, the fourth DC power supply 24 is omitted. In one embodiment of the switching circuitry 14, the input buffer 26 is omitted.

When the logic level input signal LIS has the first logic level, the first transition driver 28 charges the first capacitive element C1. Charging the first capacitive element C1 may be based on the first DC power supply signal DC1. Further, in one embodiment of the switching circuitry 14, when the logic level input signal LIS has the first logic level and a steady-state condition is reached, the first transition driver 28 presents a high impedance to the output OUT, the on-state sustaining driver 30 presents a high impedance to the output OUT, and the off-state sustaining driver 32 drives the output OUT, thereby providing the switching control output signal SOS to select an OFF state of the switching device 16 (FIG. 1). The switching control output signal SOS may be based on the logic level output signal LOS or the fourth DC power supply signal DC4.

In one embodiment of the switching circuitry 14, when the logic level input signal LIS has the second logic level and a steady-state condition is reached, the first transition driver 28 presents a high impedance to the output OUT, the off-state sustaining driver 32 presents a high impedance to the output OUT, and the on-state sustaining driver 30 drives the output OUT, thereby providing the switching control output signal SOS to select an ON state of the switching device 16 (FIG. 1). The switching control output signal SOS may be based on the logic level output signal LOS or the third DC power supply signal DC3.

When the logic level input signal LIS has the first logic level, the first transition driver 28 charges the first capacitive element C1. Charging the first capacitive element C1 may be based on the first DC power supply signal DC1. Further, in an alternate embodiment of the switching circuitry 14, when the logic level input signal LIS has the first logic level and a steady-state condition is reached, the first transition driver 28 presents a high impedance to the output OUT, the off-state sustaining driver 32 presents a high impedance to the output OUT, and the on-state sustaining driver 30 drives the output OUT, thereby providing the switching control output signal SOS, which may be based on the logic level output signal LOS or the third DC power supply signal DC3.

In an alternate embodiment of the switching circuitry 14, when the logic level input signal LIS has the second logic level and a steady-state condition is reached, the first transition driver 28 presents a high impedance to the output OUT, the on-state sustaining driver 30 presents a high impedance to the output OUT, and the off-state sustaining driver 32 drives the output OUT, thereby providing the switching control output signal SOS, which may be based on the logic level output signal LOS or the fourth DC power supply signal DC4.

In one embodiment of the switching circuitry 14, when the logic level input signal LIS transitions from the first logic level to the second logic level, the first transition driver 28 drives the output OUT, thereby at least partially providing the switching control output signal SOS to rapidly transition the switching control output signal SOS.

Figure 7:
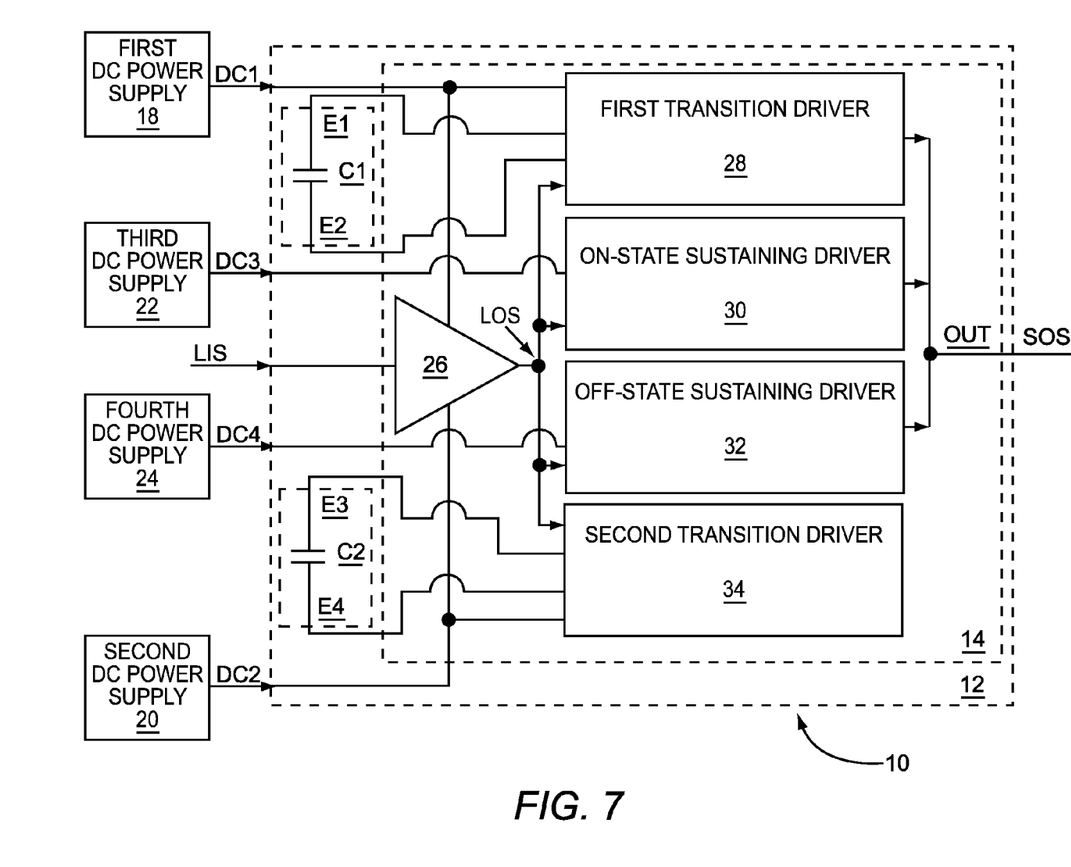
FIG. 7 illustrates the circuit according to an alternate embodiment of the circuit.

FIG. 7 illustrates the circuit 10 according to an alternate embodiment of the circuit 10. The switching device driver 12 illustrated in FIG. 7 is similar to the switching device driver 12 illustrated in FIG. 6, except in the switching device driver 12 illustrated in FIG. 7, the switching device driver 12 further includes the second capacitive element C2 and the switching circuitry 14 further includes a second transition driver 34.

The second transition driver 34 is coupled between the output from the input buffer 26 and the output OUT. The second capacitive element C2 is coupled to the second transition driver 34. The second DC power supply 20 further provides the second DC power supply signal DC2 to the second transition driver 34. The input buffer 26 further provides the logic level output signal LOS to the second transition driver 34. When the logic level input signal LIS has the second logic level, the second transition driver 34 charges the second capacitive element C2. Charging the second capacitive element C2 may be based on the second DC power supply signal DC2.

In one embodiment of the switching circuitry 14, when the logic level input signal LIS has the first logic level and a steady-state condition is reached, the second transition driver 34 presents a high impedance to the output OUT. In one embodiment of the switching circuitry 14, when the logic level input signal LIS has the second logic level and a steady-state condition is reached, the second transition driver 34 presents a high impedance to the output OUT, When the logic level input signal LIS transitions from the second logic level to the first logic level, the second transition driver 34 at least partially discharges the second capacitive element C2 to rapidly transition the switching control output signal SOS, thereby causing the switching device 16 to quickly change states.

Figure 8:
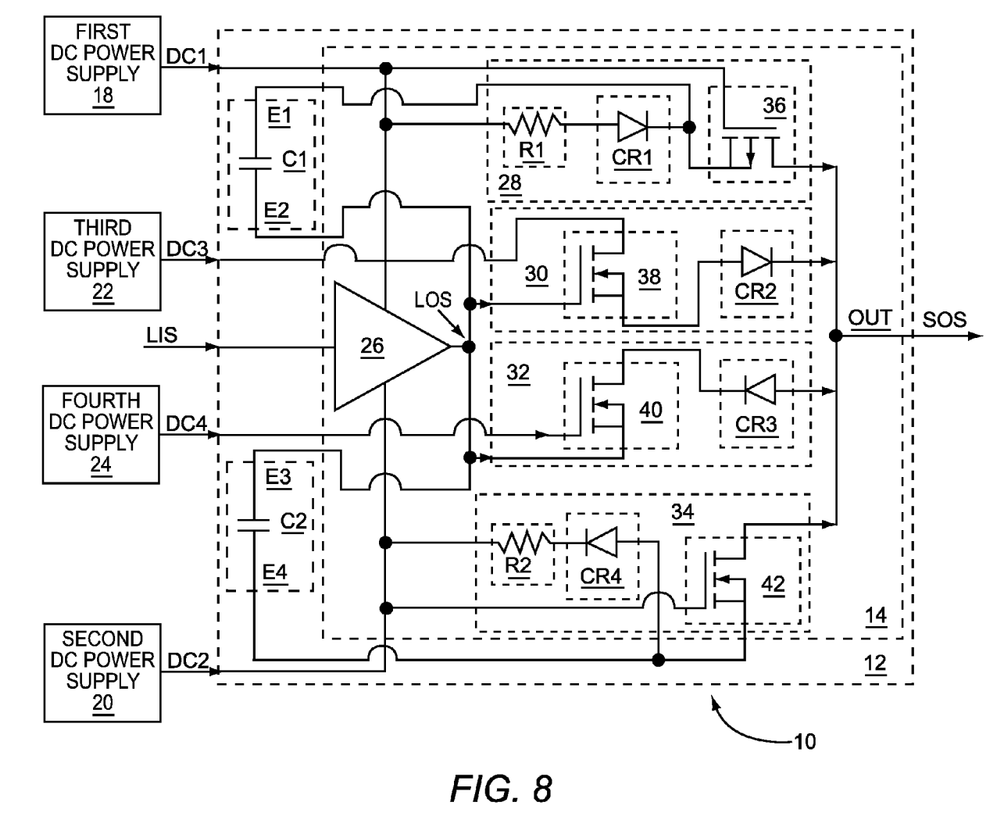
FIG. 8 illustrates the circuit according to an additional embodiment of the circuit.

FIG. 8 illustrates the circuit 10 according to an additional embodiment of the circuit 10. In the embodiment shown, the first DC power supply signal DC1 has a positive voltage with respect to a ground (not shown) and the second DC power supply signal DC2 has a negative voltage with respect to the ground (not shown). The first transition driver 28 illustrated in FIG. 8 is similar to the first transition driver 28 illustrated in FIG. 7, except the first transition driver 28 illustrated in FIG. 8 includes a first switching element 36, a first diode element CR1, and a first resistive element R1. In one embodiment of the first switching element 36, the first switching element 36 is a P-type MOSFET, as shown.

A source of the first switching element 36 is coupled to a cathode of the first diode element CR1 and to the first end E1 of the first capacitive element C1. A gate of the first switching element 36 is coupled to the first DC power supply 18. A drain of the first switching element 36 is coupled to the output OUT. An anode of the first diode element CR1 is coupled to one end of the first resistive element R1. An opposite end of the first resistive element R1 is coupled to the first DC power supply 18. The second end E2 of the first capacitive element C1 is coupled to the output from the input buffer 26. The first DC power supply signal DC1 has a first voltage magnitude, which is positive. The second DC power supply signal DC2 has a second voltage magnitude, which is negative.

When the logic level input signal LIS has the first logic level, which is a logic LOW in the embodiment shown, the logic level output signal LOS has a voltage magnitude about equal to the second voltage magnitude. Therefore, the first capacitive element C1 will be charged from the first DC power supply 18 through the first resistive element R1 and the first diode element CR1 until the first capacitive element C1 has a voltage magnitude about equal to a difference between the first voltage magnitude and the second voltage magnitude less a forward diode drop across the first diode element CR1. For example, if the first voltage magnitude is equal to 10 volts, the second voltage magnitude is equal to −10 volts, and the forward diode drop is equal to about 0.6 volts, then the voltage magnitude of the first capacitive element C1 is equal to about 19.4 volts, which is on the order of about 20 volts. Since a voltage at the gate of the first switching element 36 is never less than a voltage at the source of the first switching element 36 when the logic level input signal LIS has the first logic level, the first switching element 36 remains in an OFF state.

When the logic level input signal LIS transitions from the first logic level to the second logic level, which is a logic HIGH in the embodiment shown, the logic level output signal LOS transitions from a voltage magnitude about equal to the second voltage magnitude to a voltage magnitude about equal to the first voltage magnitude. Therefore, a voltage magnitude at the second end E2 of the first capacitive element C1 will transition from the second voltage magnitude to the first voltage magnitude, which is a voltage swing of about 20 volts in the example shown, thereby applying about +30 volts to the source of the first switching element 36. As a result, the first switching element 36 quickly changes from the OFF state to an ON state, since the gate becomes negatively biased with a voltage magnitude of about +10 volts in the example shown, thereby causing a rapid transition of the switching control output signal SOS. The first switching element 36 will remain in the ON state until the first capacitive element C1 discharges below a gate-to-source threshold of the first switching element 36.

The on-state sustaining driver 30 illustrated in FIG. 8 is similar to the on-state sustaining driver 30 illustrated in FIG. 7, except the on-state sustaining driver 30 illustrated in FIG. 8 includes a second switching element 38 and a second diode element CR2. In one embodiment of the second switching element 38, the second switching element 38 is an N-type MOSFET, as shown. A source of the second switching element 38 is coupled to an anode of the second diode element CR2. A drain of the second switching element 38 is coupled to the third DC power supply 22. A gate of the second switching element 38 is coupled to the output from the input buffer 26. A cathode of the second diode element CR2 is coupled to the output OUT.

When the logic level input signal LIS has the first logic level, which is a logic LOW in the embodiment shown, the logic level output signal LOS has a voltage magnitude about equal to the second voltage magnitude. As such, after steady-state conditions are reached, the second diode element CR2 will become reverse biased and the second switching element 38 will be in an OFF state. Therefore, the second diode element CR2 will present a high impedance to the output OUT. Conversely, when the logic level input signal LIS has the second logic level, which is a logic HIGH in the embodiment shown, the logic level output signal LOS has a voltage magnitude about equal to the first voltage magnitude. As such, after steady-state conditions are reached, the second switching element 38 will be biased in an ON state, such that the second diode element CR2 becomes forward biased and the third DC power supply signal DC3 provides the switching control output signal SOS through the second switching element 38 and the second diode element CR2.

The off-state sustaining driver 32 illustrated in FIG. 8 is similar to the off-state sustaining driver 32 illustrated in FIG. 7, except the off-state sustaining driver 32 illustrated in FIG. 8 includes a third switching element 40 and a third diode element CR3. In one embodiment of the third switching element 40, the third switching element 40 is an N-type MOSFET, as shown. A drain of the third switching element 40 is coupled to a cathode of the third diode element CR3. A gate of the third switching element 40 is coupled to the fourth DC power supply 24. A source of the third switching element 40 is coupled to the output from the input buffer 26. An anode of the third diode element CR3 is coupled to the output OUT.

When the logic level input signal LIS has the first logic level, which is a logic LOW in the embodiment shown, the logic level output signal LOS has a voltage magnitude about equal to the second voltage magnitude. As such, after steady-state conditions are reached, the third diode element CR3 will become forward biased and the third switching element 40 will be in an ON state. Therefore, the logic level output signal LOS provides the switching control output signal SOS through the third switching element 40 and the third diode element CR3.

Conversely, when the logic level input signal LIS has the second logic level, which is a logic HIGH in the embodiment shown, the logic level output signal LOS has a voltage magnitude about equal to the first voltage magnitude. As such, after steady-state conditions are reached, the third switching element 40 will be biased in an OFF state, since the gate of the third switching element 40 is negative with respect to the source of the third switching element 40. Therefore, the third diode element CR3 and the third switching element 40 will present a high impedance to the output OUT.

The second transition driver 34 illustrated in FIG. 8 is similar to the second transition driver 34 illustrated in FIG. 7, except the second transition driver 34 illustrated in FIG. 8 includes a fourth switching element 42, a second resistive element R2, and a fourth diode element CR4. In one embodiment of the fourth switching element 42, the fourth switching element 42 is an N-type MOSFET, as shown.

A source of the fourth switching element 42 is coupled to an anode of the fourth diode element CR4 and to the fourth end E4 of the second capacitive element C2. A gate of the fourth switching element 42 is coupled to the second DC power supply 20. A drain of the fourth switching element 42 is coupled to the output OUT. A cathode of the fourth diode element CR4 is coupled to one end of the second resistive element R2. An opposite end of the second resistive element R2 is coupled to the second DC power supply 20. The third end E3 of the second capacitive element C2 is coupled to the output from the input buffer 26. The first DC power supply signal DC1 has the first voltage magnitude, which is positive. The second DC power supply signal DC2 has the second voltage magnitude, which is negative.

When the logic level input signal LIS has the second logic level, which is a logic HIGH in the embodiment shown, the logic level output signal LOS has a voltage magnitude about equal to the first voltage magnitude. Therefore, the second capacitive element C2 will be charged from the second DC power supply 20 through the second resistive element R2 and the fourth diode element CR4 until the second capacitive element C2 has a voltage magnitude about equal to a difference between the first voltage magnitude and the second voltage magnitude less a forward diode drop across the fourth diode element CR4. For example, if the first voltage magnitude is equal to 10 volts, the second voltage magnitude is equal to −10 volts, and the forward diode drop is equal to about 0.6 volts, then the voltage magnitude of the second capacitive element C2 is equal to about 19.4 volts, which is on the order of about 20 volts. Since a voltage at the gate of the fourth switching element 42 is never more than a voltage at the source of the fourth switching element 42 when the logic level input signal LIS has the second logic level, the fourth switching element 42 remains in an OFF state.

When the logic level input signal LIS transitions from the second logic level to the first logic level, which is a logic LOW in the embodiment shown, the logic level output signal LOS transitions from a voltage magnitude about equal to the first voltage magnitude to a voltage magnitude about equal to the second voltage magnitude. Therefore, a voltage magnitude at the third end E3 of the second capacitive element C2 will transition from the first voltage magnitude to the second voltage magnitude, which is a voltage swing of about 20 volts in the example shown, thereby applying about −30 volts to the source of the fourth switching element 42. As a result, the fourth switching element 42 quickly changes from the OFF state to an ON state, since the gate becomes positively biased with a voltage magnitude of about −10 volts in the example shown, thereby causing a rapid transition of the switching control output signal SOS. The fourth switching element 42 will remain in the ON state until the second capacitive element C2 discharges below a gate-to-source threshold of the fourth switching element 42.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A circuit comprising switching circuitry and a first capacitive element, wherein:
    the switching circuitry comprises a first switching element directly coupled between the first capacitive element and a switching device, such that the switching circuitry is adapted to:
    provide a switching control output signal to the switching device based on a logic level input signal; and
    at least partially discharge the first capacitive element when the logic level input signal transitions from a first logic level to a second logic level to rapidly transition the switching control output signal, thereby causing the switching device to change states.

2. The circuit of claim 1 wherein a maximum voltage at a first end of the first capacitive element is greater than a maximum voltage of the logic level input signal.

3. The circuit of claim 2 wherein the maximum voltage at the first end of the first capacitive element is on the order of about two times the maximum voltage of the logic level input signal.

4. The circuit of claim 2 wherein the maximum voltage at the first end of the first capacitive element is on the order of about three times the maximum voltage of the logic level input signal.

5. The circuit of claim 1 wherein a capacitance of the first capacitive element is based on at least one estimated input capacitance to the switching device.

6. The circuit of claim 1 further comprises the switching device.

7. The circuit of claim 1 wherein the switching device is a bipolar junction transistor element.

8. The circuit of claim 7 wherein the bipolar junction transistor element is a silicon carbide bipolar junction transistor element.

9. The circuit of claim 7 wherein a capacitance of the first capacitive element is based on at least one of an estimated base-to-emitter capacitance of the bipolar junction transistor element and an estimated base-to-collector capacitance of the bipolar junction transistor element.

10. The circuit of claim 7 wherein the switching circuitry is further adapted to provide the switching control output signal to a base of the bipolar junction transistor element.

11. The circuit of claim 1 wherein the switching device is a junction field effect transistor element.

12. The circuit of claim 11 wherein the junction field effect transistor element is a silicon carbide junction field effect transistor element.

13. The circuit of claim 11 wherein a capacitance of the first capacitive element is based on at least one of an estimated gate-to-source capacitance of the junction field effect transistor element and an estimated gate-to-drain capacitance of the junction field effect transistor element.

14. The circuit of claim 11 wherein the switching circuitry is further adapted to provide the switching control output signal to a gate of the junction field effect transistor element.

15. The circuit of claim 1 wherein the first logic level is a logic LOW and the second logic level is a logic HIGH.

16. The circuit of claim 1 wherein the first logic level is a logic HIGH and the second logic level is a logic LOW.

17. The circuit of claim 1 wherein after the logic level input signal transitions from the first logic level to the second logic level, the switching device is adapted to transition from an OFF state to an ON state.

18. The circuit of claim 1 wherein after the logic level input signal transitions from the first logic level to the second logic level, the switching device is adapted to transition from an ON state to an OFF state.

19. The circuit of claim 1 further comprising a second switching element directly coupled between a second capacitive element and the switching device, such that the switching circuitry is further adapted to:
    charge the second capacitive element when the logic level input signal has the second logic level; and
    at least partially discharge the second capacitive element when the logic level input signal transitions from the second logic level to the first logic level to rapidly transition the switching control output signal, thereby causing the switching device to quickly change states.

20. The circuit of claim 1 wherein when the logic level input signal has the first logic level, the switching circuitry is further adapted to charge the first capacitive element.

21. A method comprising:
provided a first switching element and a first capacitive element, such that the first switching element is directly coupled between the first capacitive element and a switching device:
providing a switching control output signal to the switching device based on a logic level input signal;
charging the first capacitive element when the logic level input signal has a first logic level; and
at least partially discharging the first capacitive element when the logic level input signal transitions from the first logic level to a second logic level to rapidly transition the switching control output signal, thereby causing the switching device to change states.

22. The method of claim 21 wherein a maximum voltage at a first end of the first capacitive element is greater than a maximum voltage of the logic level input signal.

23. The method of claim 21 wherein the switching device is a bipolar junction transistor element.

24. The method of claim 23 wherein a capacitance of the first capacitive element is based on at least one of an estimated base-to-emitter capacitance of the bipolar junction transistor element and an estimated base-to-collector capacitance of the bipolar junction transistor element.

* * * * *